(12) United States Patent
Nakamura et al.

(10) Patent No.: US 6,977,414 B2
(45) Date of Patent: Dec. 20, 2005

(54) SEMICONDUCTOR DEVICE

(75) Inventors: Kazutoshi Nakamura, Kanagawa (JP);
Yoshihiro Yamaguchi, Saitama (JP);
Yusuke Kawaguchi, Kanagawa (JP);
Syotaro Ono, Kanagawa (JP); Akio Nakagawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 208 days.

(21) Appl. No.: 10/460,407

(22) Filed: Jun. 13, 2003

(65) Prior Publication Data
US 2003/0235942 A1   Dec. 25, 2003

(30) Foreign Application Priority Data
Jun. 14, 2002   (JP)   .............................. 2002-173649

(51) Int. Cl.$^7$ ............................................. H01L 29/76
(52) U.S. Cl. ..................... 257/329; 257/340; 257/341
(58) Field of Search ............................ 257/329, 335, 257/337, 340, 341

(56) References Cited

U.S. PATENT DOCUMENTS

| | | |
|---|---|---|
| 4,199,774 A | 4/1980 | Plummer |
| 4,414,560 A * | 11/1983 | Lidlou .......................... 257/341 |
| 4,455,565 A | 6/1984 | Goodman et al. ........... 257/341 |
| 5,798,554 A * | 8/1998 | Grimaldi et al. ............. 257/329 |

FOREIGN PATENT DOCUMENTS

JP   2001-156294   6/2001

OTHER PUBLICATIONS

T. Sakai, et al., IEEE Transactions on Electron Devices, vol. 36, No. 7, pp. 1381-1386, "A New Vdmosfet Structure with Reduced Reverse Transfer Capacitance", Jul. 1989.

* cited by examiner

Primary Examiner—Chandra Chaudhari
(74) Attorney, Agent, or Firm—Oblon, Spivak, McClelland, Maier & Neustadt, P.C.

(57) ABSTRACT

A semiconductor device comprises: a semiconductor layer of a first conductivity type; a pair of base regions of a second conductivity type selectively provided on a surface of the semiconductor layer; and source regions of a first conductivity type, each of the source regions being selectively provided on a surface of each of the base regions. The semiconductor device further comprises an electrical field reducing region of a second conductivity type selectively provided on the surface of the semiconductor layer between the pair of the base regions; a gate insulating film provided on the surface of the base regions; a pair of gate electrodes provided on the gate insulating film, each of the gate electrodes being provided on the surface of the base regions between the source region and the electrical field reducing region; and a source electrode connected to the source regions. The electrical field reducing region is isolated from both of the gate electrode and the source electrode.

18 Claims, 15 Drawing Sheets

SEMICONDUCTOR DEVICE

CROSS-REFERENCE TO RELATED APPLICATIONS

This application is based upon and claims the benefit of priority from the prior Japanese Patent Application No. 2002-173649, filed on Jun. 14, 2002, the entire contents of which are incorporated herein by reference.

BACKGROUND OF THE INVENTION

The present invention relates to a semiconductor device, and more particularly, it relates to a semiconductor device which has a lateral type or vertical type field effect transistor structure, and is suitably applied as a device for high-speed switching or a device for power control.

As the supply voltage for CPUs decreased, the power supply with the synchronous rectification system using a field effect transistor is being greater used.

FIG. 19 is a schematic diagram showing the cross-sectional structure of MOSFET (Metal-oxide-Semiconductor Field Effect Transistor) used for such a power supply. Hereafter, a n channel type will be explained. It is also possible to acquire the similar structure about p channel type by reversing p type and n type for each semiconductor part.

This MOSFET has the so-called "vertical type" structure, where n type semiconductor region 104 is provided on $n^+$ type substrate 102, and p type base regions 106 are selectively formed on the surface of the n type semiconductor region 104. Moreover, $n^+$ type source region 108 is selectively formed on the surface of the p type base region 106, and a gate oxide film 110 and a gate electrode 112 are formed on the p type base region 106 and n– type semiconductor region 104 between the $n^+$ type source region 108 and the neighboring $n^+$ source region 108.

The source electrode 114 is connected to $n^+$ type source region 108, and the drain electrode 116 is connected to the back side of $n^+$ type substrate 102. By applying a bias voltage to the gate electrode 112, a channel can be formed on the surface of $p^+$ type base region 106, and a current can be passed between the source and the drain.

However, in the semiconductor device illustrated in FIG. 19, since the facing area between the gate and the drain is large, and since the gate and the drain have countered through gate oxide 110, the feedback capacitance between the gate and the drain is large. This feedback capacitance is one of the parameters which impede high-speed operation of the semiconductor device and increase switching loss. Therefore, it is desirable to reduce the feedback capacitance between the gate and the drain.

On the other hand, narrowing the interval between p type base regions 106 and 106 may also be considered so that the facing area between a gate and a drain may be reduced. However, in this case, since the current path between drain and source is constricted, the JFET resistance Rj corresponding to resistance of this current path becomes high, and electrical connection loss increases.

As mentioned above, in the conventional MOSFET, there was a relation of a trade-off between ON resistance and the feedback capacitance, and there was a problem that there was a limit in reducing high-speed operation, electrical connection loss, and switching loss.

SUMMARY OF THE INVENTION

According to an embodiment of the invention, there is provided a semiconductor device comprising: a semiconductor layer of a first conductivity type; a pair of base regions of a second conductivity type selectively provided on a surface of the semiconductor layer; source regions of a first conductivity type, each of the source regions being selectively provided on a surface of each of the base regions; an electrical field reducing region of a second conductivity type selectively provided on the surface of the semiconductor layer between the pair of the base regions; a gate insulating film provided on the surface of the base regions; a pair of gate electrodes provided on the gate insulating film, each of the gate electrodes being provided on the surface of the base regions between the source region and the electrical field reducing region; and a source electrode connected to the source regions, the electrical field reducing region being isolated from both of the gate electrode and the source electrode.

According to other embodiment of the invention, there is provided a semiconductor device comprising: a semiconductor layer of a first conductivity type; a plurality of base regions of a second conductivity type provided on a surface of the semiconductor layer in a matrix fashion; a plurality of source regions of a first conductivity type, each of the source regions being selectively provided on a surface of each of the base regions; a plurality of electrical field reducing regions of a second conductivity type, each of the electrical field reducing regions being selectively provided on the surface of the semiconductor layer between the base regions; a gate insulating film provided on the surface of the base regions; a gate electrode provided on the gate insulating film, the gate electrode having a lattice pattern in order to selectively cover the surface of the base regions between each of the source regions and each of the electrical field reducing regions; and a source electrode connected to the source regions.

According to other embodiment of the invention, there is provided a semiconductor device comprising: a semiconductor layer of a first conductivity type; a pair of base regions of a second conductivity type provided on a surface of semiconductor layer; a pair of source regions of a first conductivity type, each of the source regions being selectively provided on a surface of each of the base regions; an electrical field reducing region of a second conductivity type selectively provided on the surface of the semiconductor layer between the base regions; semiconductor regions of a first conductivity type between the electrical field reducing region and each of the base regions, the semiconductor regions having an impurity concentration higher than the semiconductor layer; a gate insulating film provided on the surface of the base regions; a pair of gate electrodes provided on the gate insulating film, each of the gate electrodes being provided to selectively cover the surface of each of the base regions between each of the source regions and the electrical field reducing region; and a source electrode connected to the source regions, the electrical field reducing region being connected to the source electrode and being isolated from the gate electrode.

According to other embodiment of the invention, there is provided a semiconductor device comprising: a semiconductor layer of a first conductivity type; a pair of base regions of a second conductivity type provided selectively on a surface of the semiconductor layer; a pair of source regions of a first conductivity type, each of the source regions being provided selectively on a surface of each of the base regions; a metal layer in contact with the surface of the semiconductor layer between the base regions; a gate insulating film provided on the surface of the base regions; a gate electrode provided on the gate insulating film to selectively cover the surface of the base regions between each of the source regions and the metal layer; and a source electrode connected to the source regions, the metal layer forming a Schottky junction with the semiconductor layer.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DETAILED DESCRIPTION

Referring to drawings, some embodiments of the present invention will now be described in detail.

Figure 1A:
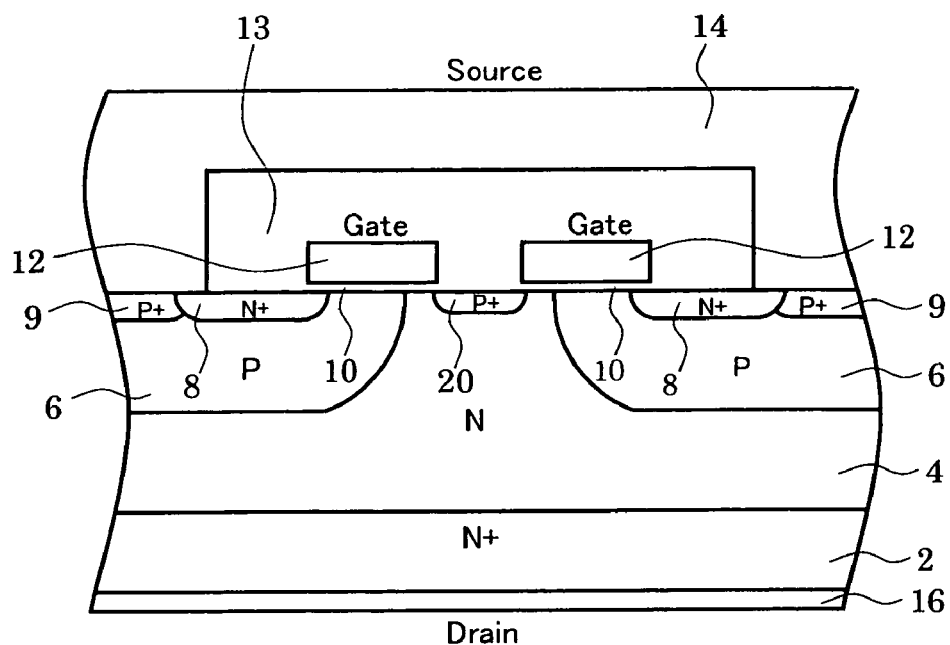
FIG. 1A is a sectional view of the semiconductor device showing the fundamental concept of the first embodiment of the invention.

FIG. 1A is a sectional view of the semiconductor device showing the fundamental concept of the first embodiment of the invention.

Figure 2A:
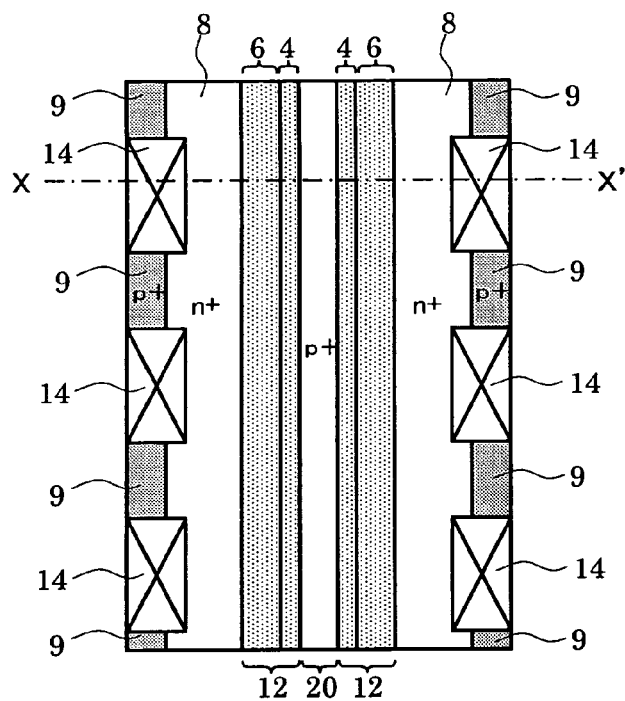
FIG. 2A is a schematic diagram which illustrates the superficial arrangement relation of each part in the surface of the semiconductor layer, and this X–X' line section corresponds to FIG. 1A.

FIG. 2A is a schematic diagram which illustrates the superficial arrangement relation of each part in the surface of that semiconductor layer, and this X–X' line section corresponds to FIG. 1A.

In the semiconductor device of this embodiment, a n type epitaxial layer 4 is formed on a n$^+$ type semiconductor substrate 2. On the n type epitaxial layer 4, p type base regions 6 are formed selectively. A n$^+$ type source region 8 and a p$^+$ type region 9 are formed in this p type base region 6. Between adjoining p type base regions 6, the p$^+$ type electric field relaxation region 20 is formed at some distance from the p type base region 6. And in the both sides of the electric field relaxation region 20, the gate electrodes 12 are formed through the gate oxide film 10, which reaches the n$^+$ type source region 8.

As for the impurity concentration of each part, the n$^+$ type semiconductor substrate 2 is set to $1 \times 10^{19} – 1 \times 10^{20}$ cm$^{-3}$, and the n type epitaxial layer 4 is set to about $1 \times 10^{16}$ cm$^{-3}$ in order obtain the breakdown voltage of about 30 volts between the source and the drain, and n type epitaxial layer 4 is set to about $3 \times 10^{15}$ cm$^{-3}$ in order to obtain the breakdown voltage of about 100 volts.

The impurity concentration of the p type base region 6 can be set to $1 \times 10^{16} – 5 \times 10^{17}$ cm$^{-3}$, and the impurity concentrations of the n$^+$ type source region 8 and the p$^+$ type region 9 can be set to $1 \times 10^{19} – 1 \times 10^{20}$ cm$^{-3}$. Furthermore, it is desirable to set the impurity concentration of the p$^+$ type electric field relaxation region 20 to more than $1 \times 10^{17}$ cm$^{-3}$, as will be explained in detail later.

The circumference of the gate electrode 12 is covered with an insulating layer 13, and the source electrode 14 is connected to the source region 8. Moreover, the drain electrode 16 is connected to the back side of the n$^+$ type substrate 2.

In this embodiment, the p$^+$ type electric field relaxation region 20 is not connected with any of the source, drain and the gate electrode, and thus the region 20 is in the state of the so-called "floating".

Figure 19:
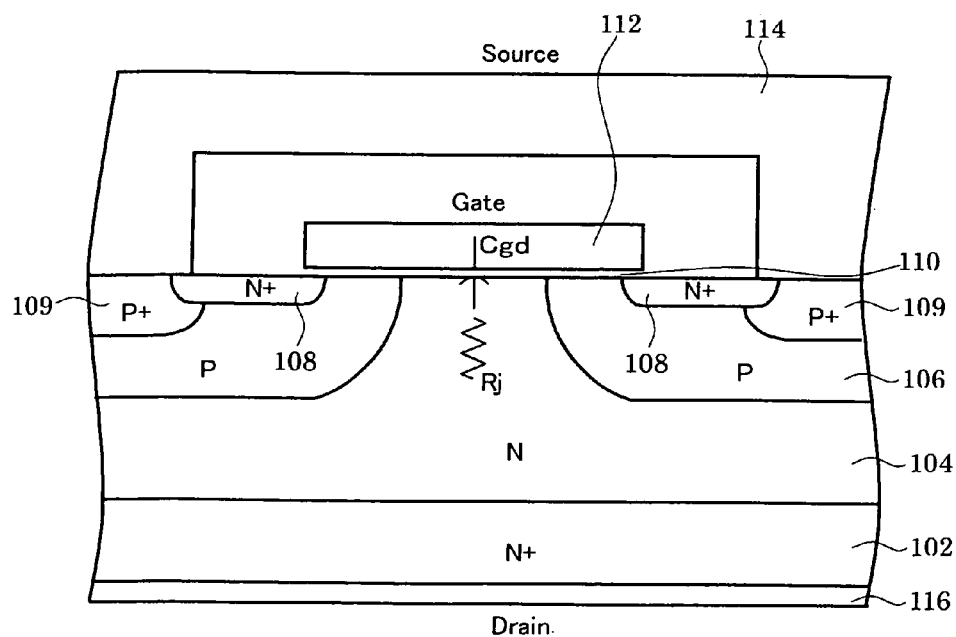
FIG. 19 is a schematic diagram showing the cross-sectional structure of MOSFET (Metal-oxide-Semiconductor Field Effect Transistor) used for such a power supply.

According to the structure explained above, by providing the p$^+$ type electric field relaxation region 20, the facing area between the gate and the drain can be made smaller than the conventional structure shown in FIG. 19. If, in the structure illustrated in FIG. 19, the gate electrode 12 is simply divided and provided in two parts, in the portion of the gap between these divided parts of the gate electrode, the effect or depletion to the JFET region (n type epitaxial layer 4) from the gate will decrease. Therefore, the JFET region cannot be depleted, and thus, a problem that the breakdown voltage between the source and the drain falls arises.

In contrast to this, instead of making the JFET region depleted by applying a bias voltage from the gate electrode 12, the p+ type electric field relaxation region 20 is provided according to the embodiment, and depletion to the JFET region from the electric field relaxation region 20 can be promoted by the function of the p-n junction. By employing such a structure, the breakdown voltage between the source and the drain can be increased, and the capacitance between the gate and the drain can be reduced.

Furthermore, by making the electric field relaxation region 20 into the state of "floating", the effect that ON resistance can be lowered is acquired, as will be explained below.

That is, if the junction depth of the electric field relaxation region 20 is deep, current concentrates between the electric field relaxation region 20 and the p type base regions 6, and non-negligible resistance may arise in these regions. If the electric field relaxation region 20 and the source electrode 14 are made into the same potential, the regions between the electric field relaxation region 20 and the p type base regions 6 can easily be depleted. If voltage is applied to the drain electrode 16 in the state of ON, the cross-section area of the current path in the regions between the electric field relaxation region 20 and the p type base regions 6 will be decreased by the depletion layers extending from the electric field relaxation region 20 and the p type base regions 6 respectively. Therefore, the ON resistance increases.

In contrast to this, when the electric field relaxation region 20 is made into "floating" state, the potential of the electric field relaxation region 20 is determined by the overlap capacitance (oxide film capacitance) between the gate electrode and the electric field relaxation region 20, and by the junction capacitance between the electric field relaxation region 20 and the JFET region.

Compared with the case where the source electrode 14 and the electric field relaxation region 20 are made into the same potential, the potential of the electric field relaxation region 20 is dragged by the potential of the gate electrode in an ON state, and becomes higher compared with the potential of the source electrode 14, and depletion from the electric field relaxation region 20 becomes weaker. Therefore, reduction of the cross-section area of the current path in the regions between the electric field relaxation region 20 and the p type base regions 6 can be suppressed, and the effect that ON resistance becomes smaller is acquired.

In this structure, the junction depth of the electric field relaxation region 20 may preferably be shallower compared with the junction depth of the p type base regions 6. It is because influence of the resistance in the regions between the electric field relaxation region 20 and the p type base regions 6 can be made smaller if this junction depth becomes shallow enough. In order to prevent the increase of ON resistance, the junction depth of the electric field relaxation region 20 is preferably below smaller than half of the junction depth of the p type base regions 6. For example, when the junction depth of the p type base regions 6 is made into about one micrometer, as for the junction depth of the electric field relaxation region 20, it is desirable to make it 0.5 micrometers or less.

Moreover, as for the electric field relaxation region 20, it is desirable to set the impurity concentration thereof so that it may not be depleted completely at the time of operation of the device. In order to prevent the complete depletion, it is desirable to make the net dose amount of the electric field relaxation region 20 more than $4 \times 10^{12}$ cm$^{-2}$, and to make the impurity concentration thereof more than $1 \times 10^{17}$ cm$^{-3}$.

Figure 1B:
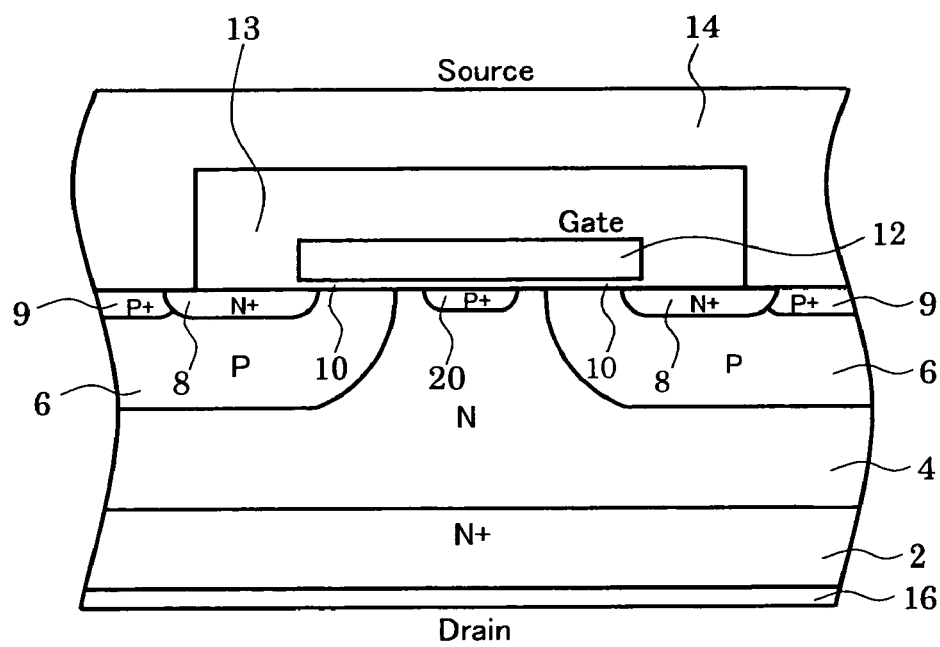
FIG. 1B is a sectional view of the semiconductor device showing another example of the fundamental concept of the first embodiment of the invention.

FIG. 1B is a sectional view of the semiconductor device showing another example of the fundamental concept of the first embodiment of the invention.

Figure 2B:
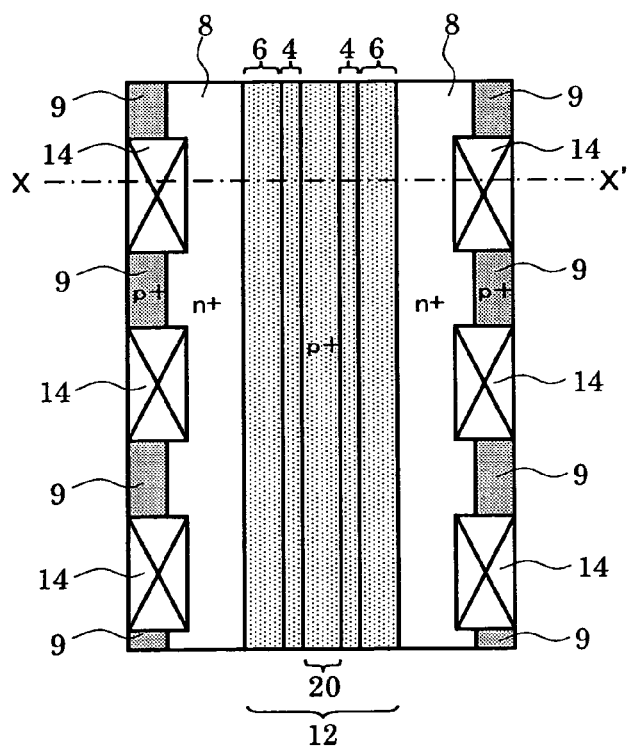
FIG. 2B is a schematic diagram which illustrates the superficial arrangement relation of each part in the surface of the semiconductor layer, and this X–X' line section corresponds to FIG. 1B.

And FIG. 2B is a schematic diagram which illustrates the superficial arrangement relation of each part in the surface of the semiconductor layer, and this X–X' line section corresponds to FIG. 1B.

As shown in these figures, the gate electrode 12 may be formed in one body covering the electric field relaxation region 12. By forming the gate electrode 12 in such a broader stripe form, the wiring resistance of the gate electrode can be advantageously reduced.

Figure 3:
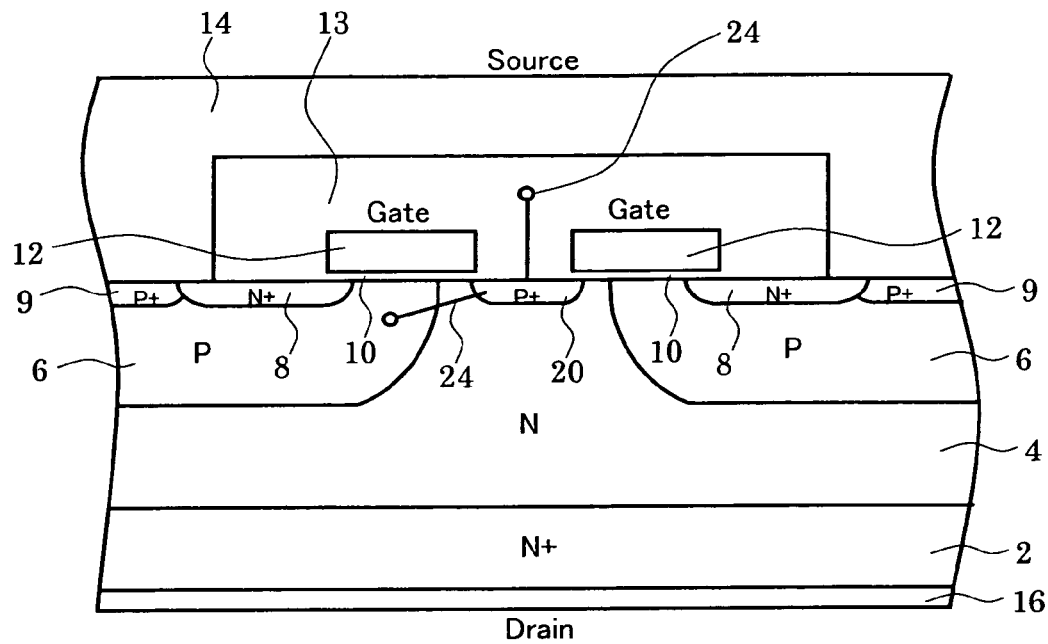
FIG. 3 is a sectional view of the semiconductor device for explaining the fundamental concept of a second embodiment of the invention.

FIG. 3 is a sectional view of the semiconductor device for explaining the fundamental concept of a second embodiment of the invention. The same symbols are given to the same elements as what were mentioned above about FIGS. 1A through 2B about this figure, and detailed explanation will be omitted.

Also in this embodiment, the p+ type electric field relaxation region 20 is provided. By employing such a structure, the breakdown voltage between the source and the drain can be increased, and the capacitance between the gate and the drain can be reduced. In this embodiment, further, the electric field relaxation region 20 is connected to the source electrode 14 or the p type base region 6 via the connection path 24 in order to make the electric field relaxation region 20 at the same potential. By employing such a structure, depletion to the JFET region from the electric field relaxation region 20 can be promoted.

As the result, impurity concentration of a JFET region can be made higher, and when the junction depth of the electric field relaxation region 20 is shallow enough, ON resistance can be lowered. That is, depletion of the JFET region is promoted by providing the connection path 24 and by controlling the potential of the electric field relaxation region 20. Since the depletion is promoted, impurity concentration of the JFET region can be made higher. With regard to the connection path 24 of this embodiment, various kinds of characteristic structures can be mentioned, as will be explained in full detail later.

Although the semiconductor region which has p type impurities is illustrated as the electric field relaxation region 20 in FIG. 1A through FIG. 3, the invention is not limited to this. For example, the invention also includes the structure where a Schottky junction formed between a metal and a semiconductor is employed, as will be explained with reference to FIG. 6 later. That is, it is also possible to reduce the capacitance between the gate and the drain similarly by providing a metal layer on the n type epitaxial layer 4 in order to form a Schottky junction, and by extending a depletion region from this junction to the JFET region.

In the above, the fundamental structures of the semiconductor device of the invention have been explained, referring to FIG. 1A through FIG. 3. Hereafter, some examples of the semiconductor device of these first and the second embodiment will be explained in detail. About the drawings of these examples, the same symbols are given to the same elements as what were mentioned above, and detailed explanation will be omitted.

Moreover, each example explained below shall contain both features of above-mentioned first and second embodiment, unless reference is especially made. That is, the electric field relaxation region 20 may be in a state of "floating", or it may be at the same potential with the source region 14, etc. by providing the connection path 24 appropriately.

Figure 4:
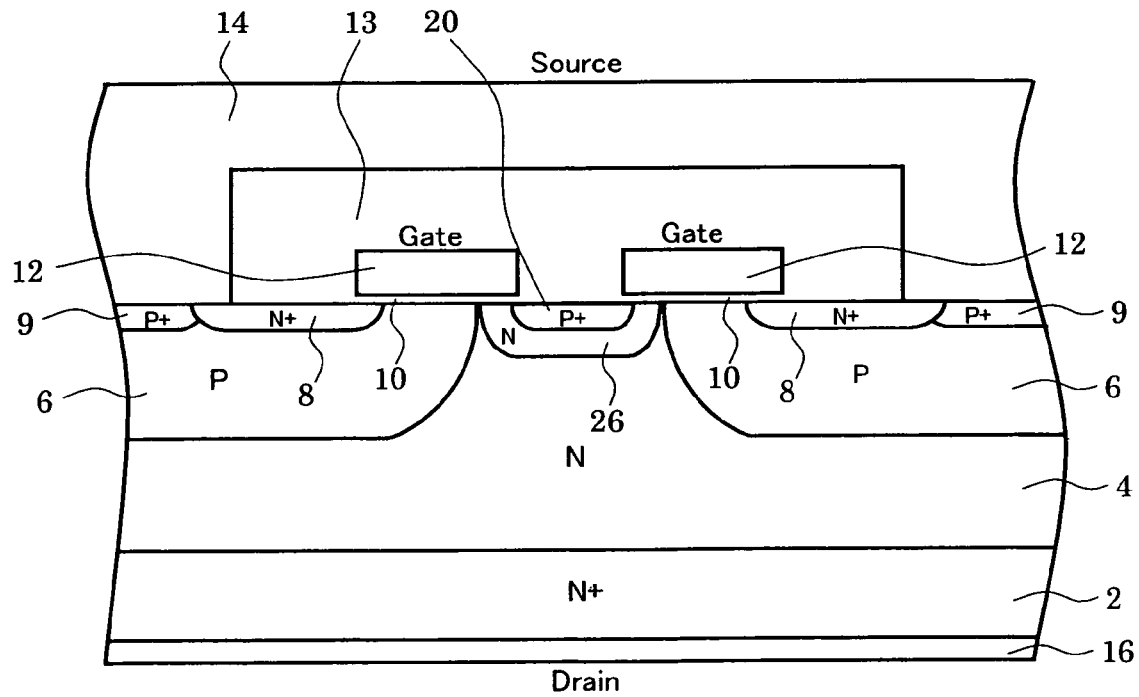
FIG. 4 is a sectional view showing the first example of the semiconductor device of the invention.

FIG. 4 is a sectional view showing the first example of the semiconductor device of the invention. In this example, a n type diffusion region 26 is provided so that the p$^+$ type electric field relaxation region 20 maybe surrounded thereby. The n type diffusion region 26 has impurity concentration higher than the n type epitaxial layer 4. Since depletion is promoted near the p$^+$ type electric field relaxation region 20, then type diffusion region 26 where impurity concentration is high can be depleted. Therefore, resistance of the JFET region can be lowered by controlling the increase in the capacitance between the gate and the drain by providing the n type diffusion region 26 with high impurity concentration.

Moreover, in this example, after forming the gate electrode 12, the n type diffusion region 26 and the electric field relaxation region 20 can be formed in a self-aligning fashion. That is, the p$^+$ type electric field relaxation region 20 and the n type diffusion region 26 with high impurity concentration can be formed by using the gate electrode 12 as a mask and by introducing the n type impurities deeply while introducing the p type impurities shallowly by the methods such as ion implantation.

Figure 5:
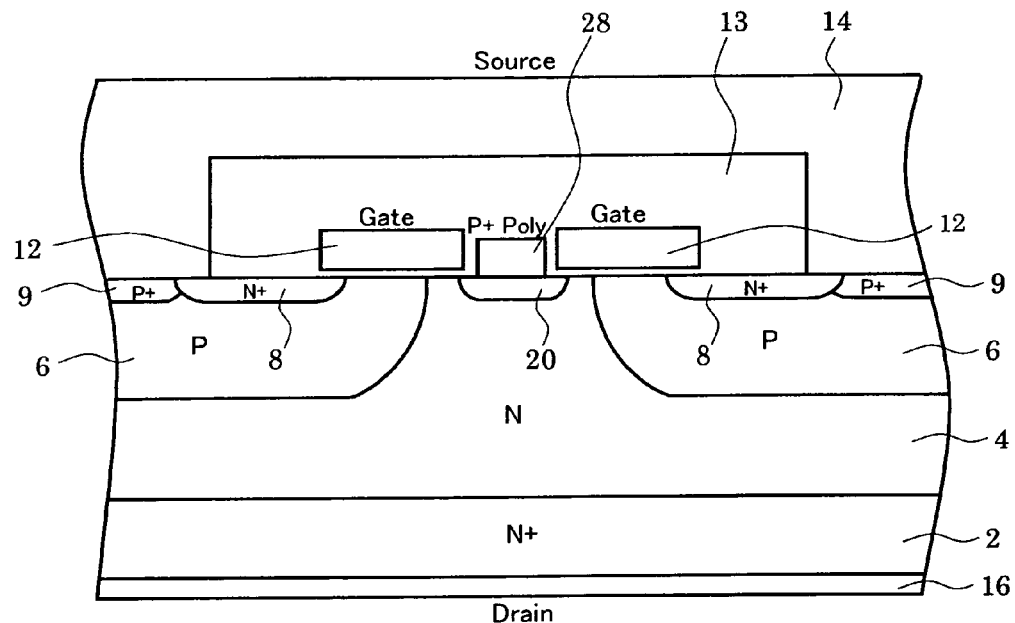
FIG. 5 is a sectional view showing the second example of the semiconductor device of the invention.

FIG. 5 is a sectional view showing the second example of the semiconductor device of the invention. In this example, a polycrystalline silicon layer 26 containing p type impurities is provided on the semiconductor layer. And p type impurities have diffused near the surface of the n type epitaxial layer 4 from the polycrystalline silicon layer 28 in order to form the p$^+$ type electric field relaxation region 20.

Like the first embodiment, the polycrystalline silicon layer 2a may be in a floating state, or may have the same potential as the source electrode 14 like the second embodiment.

Figure 6:
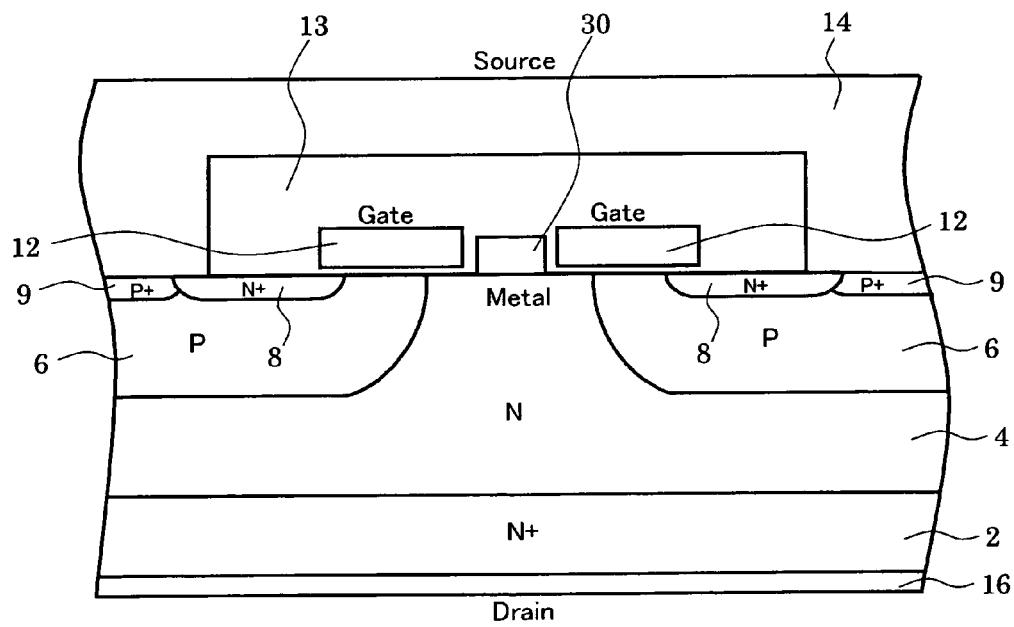
FIG. 6 is a sectional view showing the third example of the semiconductor device of the invention.

FIG. 6 is a sectional view showing the third example of the semiconductor device of the invention. In this example, a metal layer 30 is provided on the semiconductor layer. And the depletion region formed by the Schottky junction of the metal and the semiconductor is provided so that it may extend to the JFET region. That is, the effect of depletion by the Schottky junction is used instead of providing the p$^+$ type electric field relaxation region 20. By employing such a structure, the capacitance between the gate and the drain can be reduced.

And also in this example, like the first embodiment, the metal layer 30 may be in a floating state, or may have the same potential as the source electrode 14 like the second embodiment.

Figure 7:
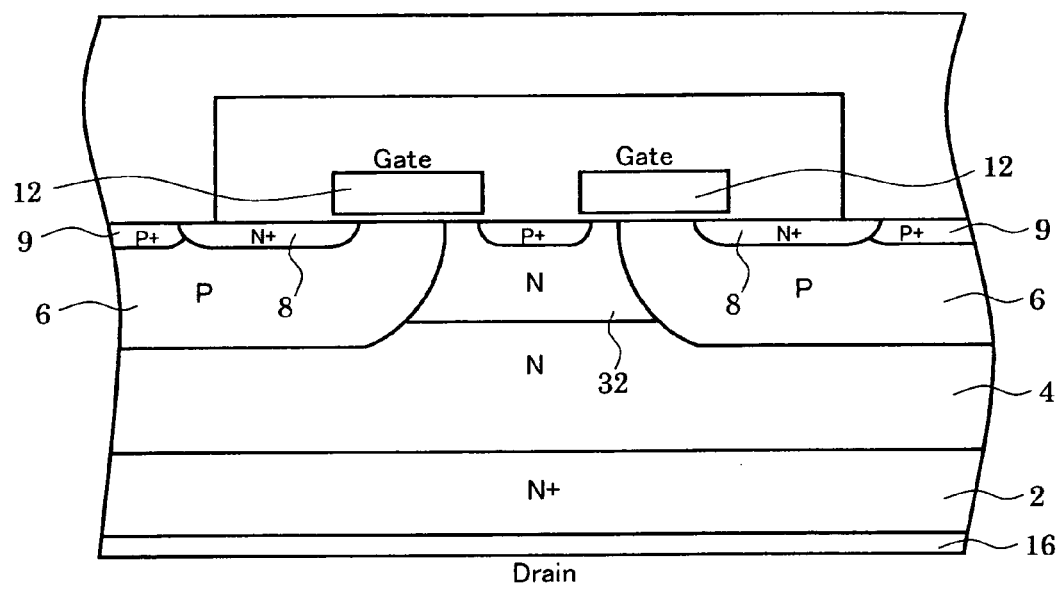
FIG. 7 is a sectional view showing the fourth example of the semiconductor device of the invention.

FIG. 7 is a sectional view showing the fourth example of the semiconductor device of the invention. This example is similar to the first example mentioned above, and the n type diffusion layer 32 is provided under the p$^+$ type electric field relaxation region 20. The n type diffusion layer 32 has impurity concentration higher than the n type epitaxial layer 4, and can reduce resistance of the JFET region. And since the depletion is promoted near the electric field relaxation region 20 also in this example, even if the n type diffusion layer 32 is provided, depletion of the JFET region can be achieved to some extent.

Figure 8A:
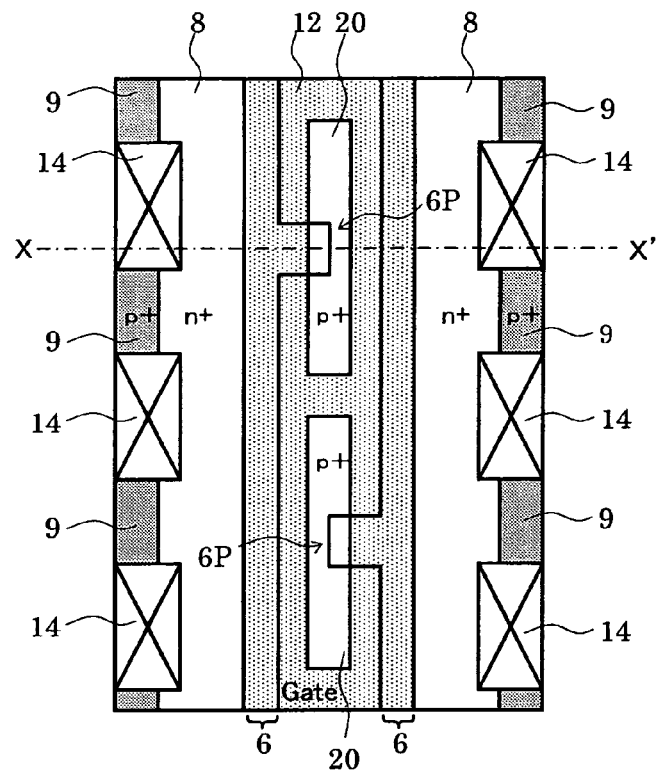
FIG. 8A is a schematic diagram showing the plane structure of the fifth example of the semiconductor device of the invention.

FIG. 8A is a schematic diagram showing the plane structure of the fifth example of the semiconductor device of the invention. That is, this figure expresses the superficial arrangement relation of each element seen from the surface side of the semiconductor layer.

Figure 9A:
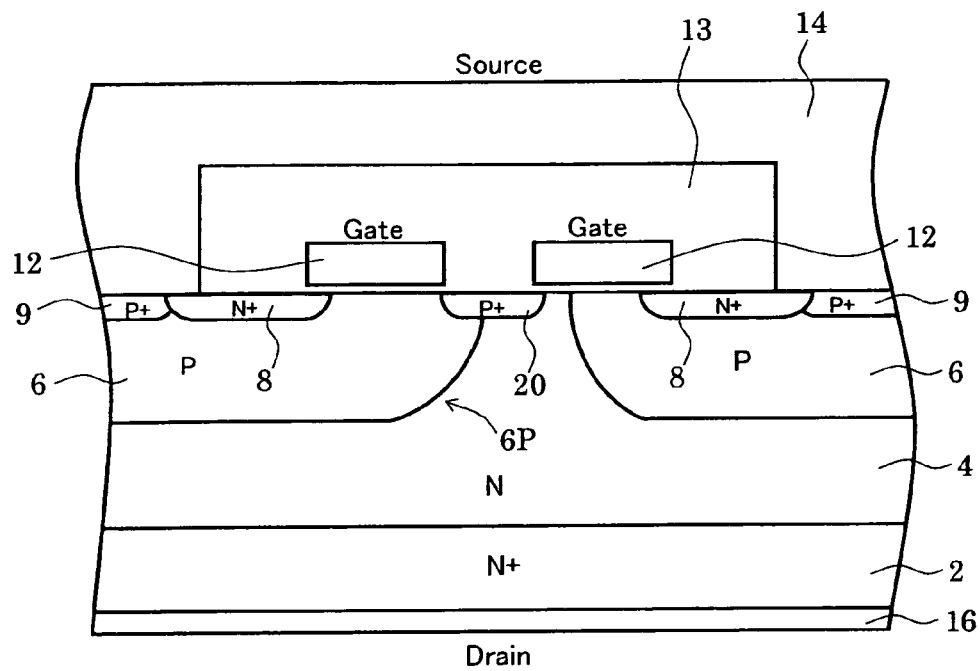
FIG. 9A is the X–X' line sectional view of FIG. 8A.

And, FIG. 9A is the X–X' line sectional view of FIG. 8A.

Under the environment of high-speed operation, the gate resistance also exerts a big influence besides the capacitance between the gate and the drain. The gate resistance can be reduced by transforming the pattern of the shape of a simple stripe which was illustrated in FIGS. 2A and 2B, into the shape as shown in FIG. 8A.

That is, in the case of this example, the p$^+$ type electric field relaxation region 20 is provided in the shape of some islands, as illustrated in FIG. 8A. And the gate electrode 12 has a shape of a "ladder", where a pair of vertical stripes are connected by the horizontal bars in corresponding to the pattern of the electric field relaxation region 20. Thus, by appropriately connecting a pair of vertical stripes to form the ladder structure, the wiring resistance of the gate electrode 12 can be reduced and the gate resistance can be lowered.

Furthermore, in the case of this example, the p$^+$ type electric field relaxation region 20 is not made into floating, but connected by providing the terminal area 6P from the p type base region 6 and made into the same potential. Thus, depletion can be promoted by making the electric field relaxation region 20 into the same potential as the p type base region 6.

In addition, in this example, the electric field relaxation region 20 may be short circuited with the source electrode 14, however it is necessary to provide the electrically conductive material as the connection path 24 in somewhere in that case. Then, the process margin of the connection path 24 and the gate electrode 12 must be kept, and there may be a demerit that the element area may increase. In contrast to this, according to the structure of this example, the potential of the electric field relaxation region 20 is controlled, and depletion can be promoted without increasing element area.

In addition, as an example of transformation of this example, the structure where the electric field relaxation region 20 is in a floating state without being connected with the p type base region 6 is also included by the range of the invention.

Figure 8B:
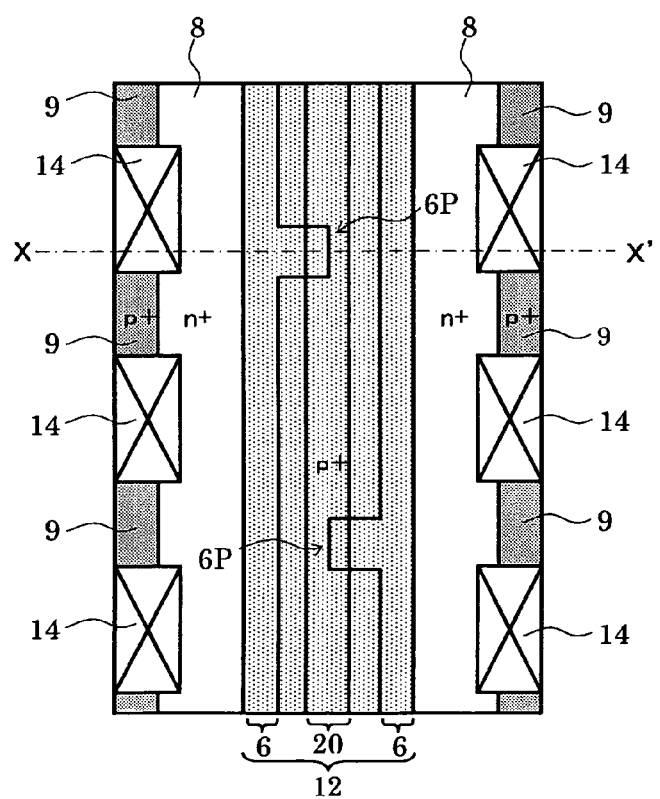
FIG. 8B is a schematic diagram showing the plane structure of a modification of the fifth example of the semiconductor device of the invention.

FIG. 8B is a schematic diagram showing the plane structure of a modification of the fifth example of the semiconductor device of the invention.

Figure 9B:
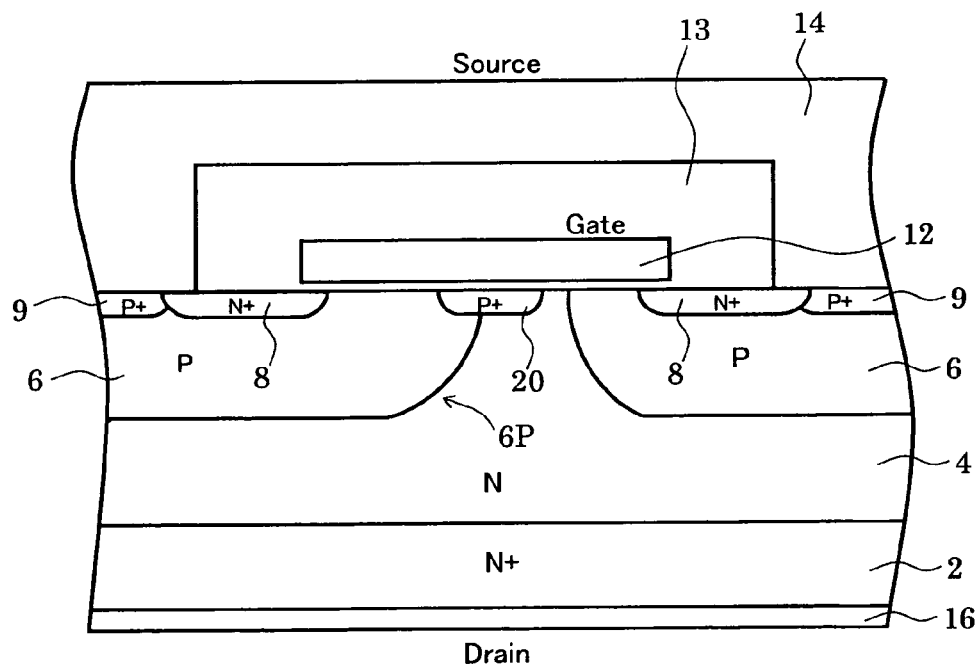
FIG. 9B is the X–X' line sectional view of FIG. 8B.

And FIG. 9B is the X–X' line sectional view of FIG. 8B.

In this modification, the gate electrode 12 is formed in one body like the example shown in FIGS. 1B and 2B. The electric field relaxation region 20 is formed in a single stripe pattern and is covered by the gate electrode 12. By forming the gate electrode 12 in such a broad single stripe form, the wiring resistance of the gate electrode 12 can be advantageously reduced.

Figure 8C:
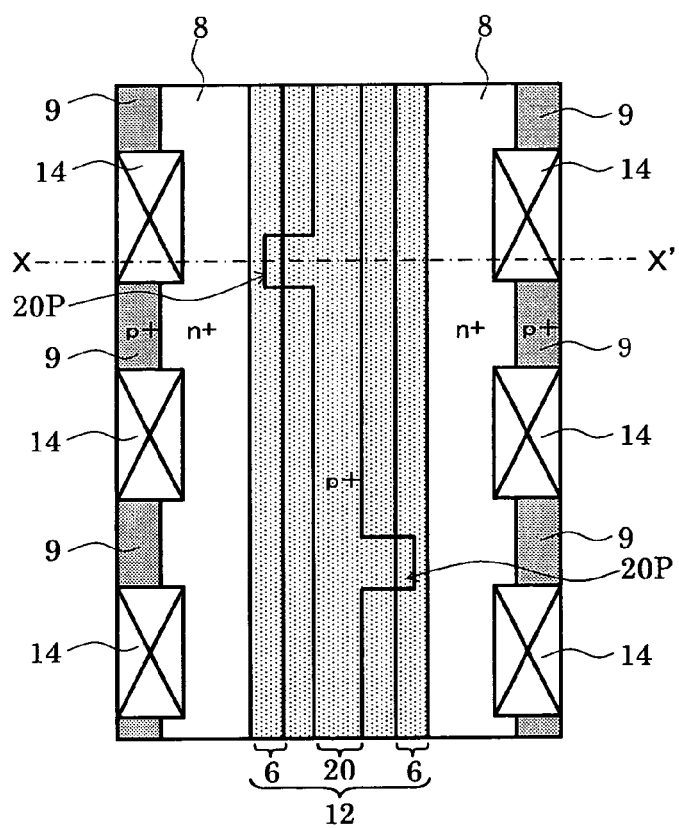
FIG. 8C is a schematic diagram showing the plane structure of another modification of the fifth example of the semiconductor device of the invention.

FIG. 8C is a schematic diagram showing the plane structure of another modification of the fifth example of the semiconductor device of the invention.

Figure 9C:
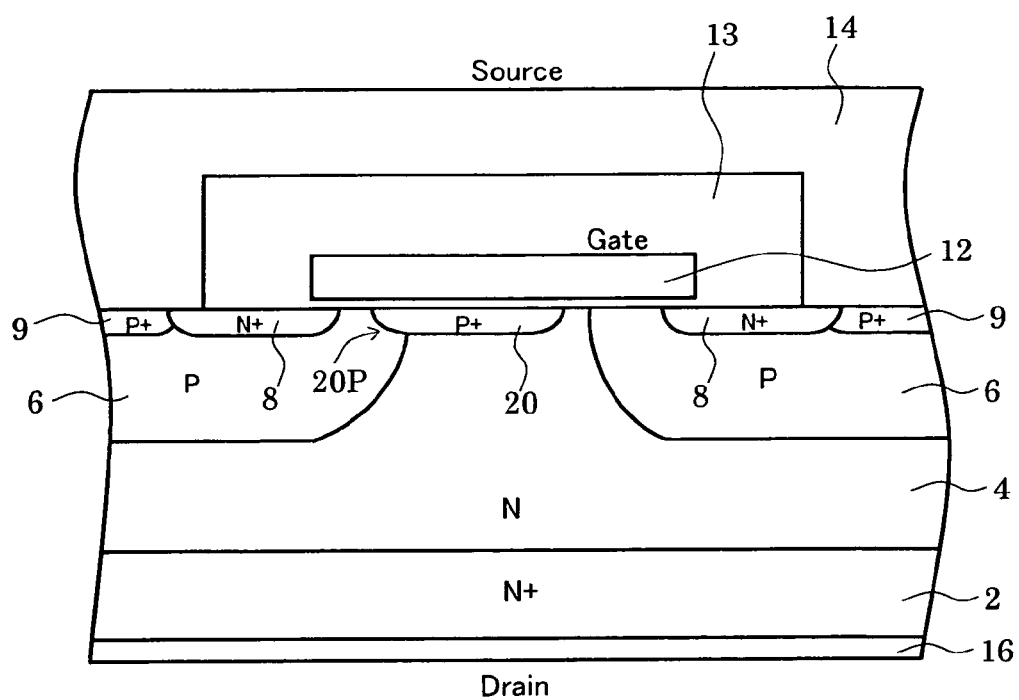
FIG. 9C is the X–X' line sectional view of FIG. 8C.

And FIG. 9C is the X–X' line sectional view of FIG. 8C.

In this modification, the gate electrode 12 is also formed in one body like the first modification shown in FIGS. 8B and 9B. Further, the electric field relaxation region 20 is formed in a single stripe pattern and has terminal areas 20 p extending to the base regions 6. That is, instead of providing the terminal areas 6P as shown in FIGS. 8B and 9B, the terminal areas 20P are provided in order to connect the electric field relaxation region 20 to the base regions 6. Thus, the electric field relaxation region 20 can be successfully kept at the same potential as the p type base regions 6.

Figure 10:
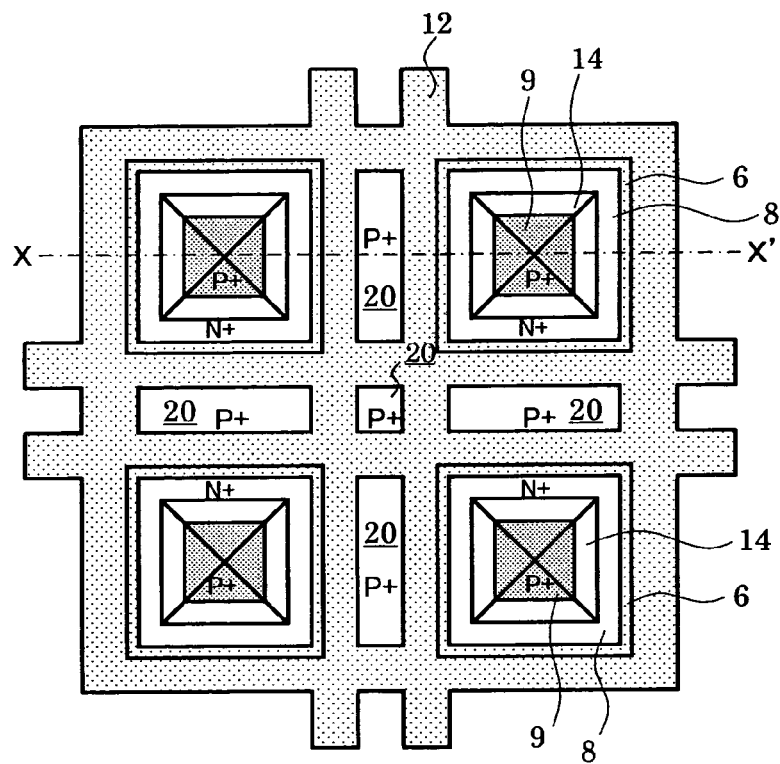
FIG. 10 is a schematic diagram showing the plane structure of the sixth example of the semiconductor device of the invention.

FIG. 10 is a schematic diagram showing the plane structure of the sixth example of the semiconductor device of the invention. That is, this figure also expresses the superficial arrangement relation of each element in the surface of the semiconductor layer.

Channel density must be made high in order to reduce channel resistance of FET. The channel density can be increased by forming the base region 6 in the shape of a matrix and arranging the gate electrode 12 in the shape of a lattice corresponding to this, as illustrated in FIG. 10.

And also in this example, the electric field relaxation regions 20 are provided between the gate electrodes 12 so that the capacitance between gate and drain may be reduced.

Figure 11:
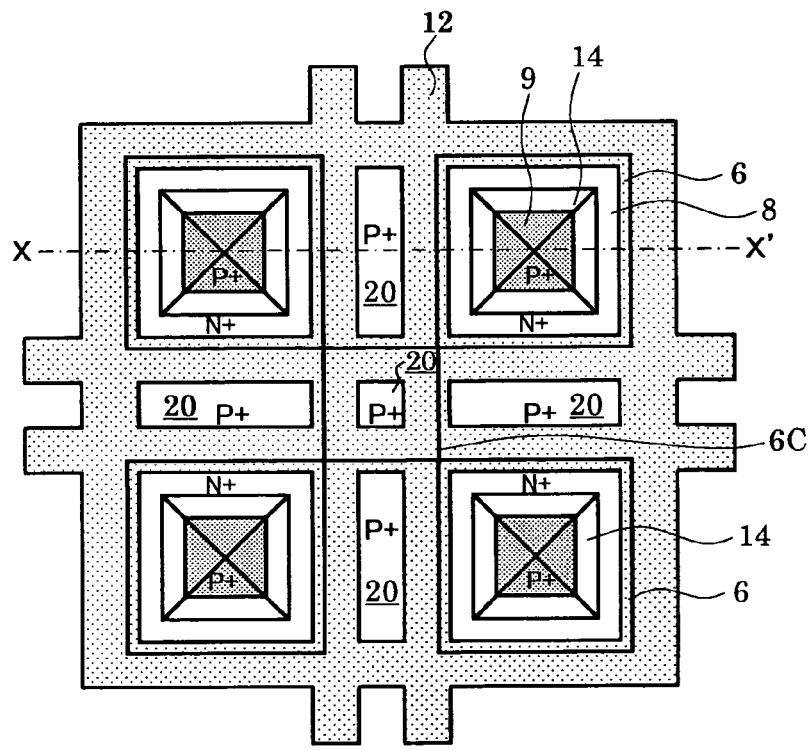
FIG. 11 is a schematic diagram showing the plane structure of the seventh example of the semiconductor device of the invention.

FIG. 11 is a schematic diagram showing the plane structure of the seventh example of the semiconductor device of the invention. That is, this figure also expresses the superficial arrangement relation of each element in the surface of the semiconductor layer.

Also in this example, channel density can be increased by arranging the gate electrode 12 in the shape of a lattice. However, in such a lattice-like layout, the electric field may concentrate at the region (region near the center of the figure) surrounded by the portion of the angles of the four $n^+$ type source regions 8. This is because the interval of the p type base -region 6 and the p type base region 6 becomes wide, as seen in the direction of the diagonal.

Then, in order to reduce the electric field, the p type base region 6C is formed in the center surrounded by the four source regions 8. By employing such a structure, points on which the electric field concentrates can be removed and the breakdown voltage between the source and the drain can be improved.

Figure 12:
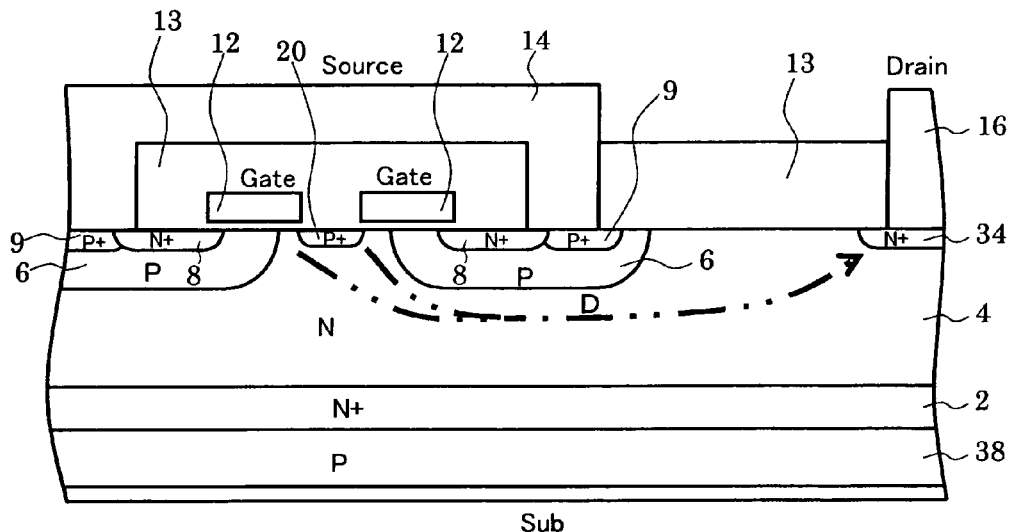
FIG. 12 is a schematic diagram which illustrates the cross-sectional structure of the eighth example of the semiconductor device of the invention.

FIG. 12 is a schematic diagram which illustrates the cross-sectional structure of the eighth example of the semiconductor device of the invention. That is, this example has a structure of so-called "lateral type" FET, where $n^+$ type region 34 is provided on the surface of the n type epitaxial layer 4 and the drain electrode 16 is connected to the surface side. In the case of this structure, as indicated by the arrow D, many components of drain current flow through the n type epitaxial layer 4.

Also in such lateral type structures, the same effects as what were mentioned above with reference to FIG. 1A through FIG. 11 can be acquired. Since there are many drain current components which flow through the n type epitaxial layer 4 having a low impurity concentration in the case of this example, although a current is lowered, it is advantageous at the point that the element size can make smaller.

Figure 13:
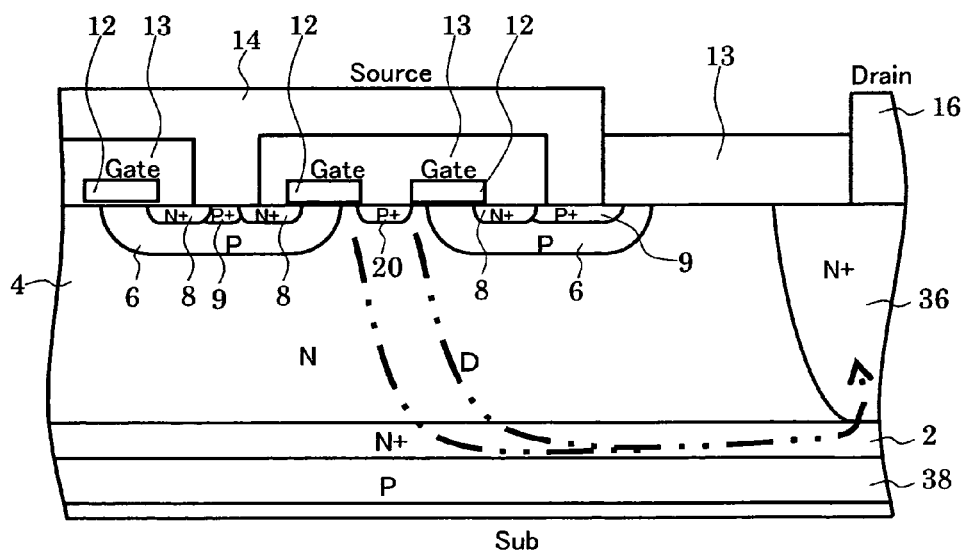
FIG. 13 is a schematic diagram which illustrates the cross-sectional structure of the ninth example of the semiconductor device of the invention.

FIG. 13 is a schematic diagram which illustrates the cross-sectional structure of the ninth example of the semiconductor device of the invention. That is, this example is also the so-called "lateral type" FET, where the $n^+$ type region 36 which penetrates the n type epitaxial layer 4 and reaches the $n^+$ layer 2 is provided, and the drain electrode 16 is connected to the surface side. In the case of this structure, the drain current flows to $n^+$ type region 36 through the $n^+$ type layer 2.

Also in such width type structure, the same effects as what were mentioned above with reference to FIG. 1A through FIG. 11 can be acquired. Moreover, in the case of this example, it is advantageous at the point that the drain current can be increased.

Figure 14:
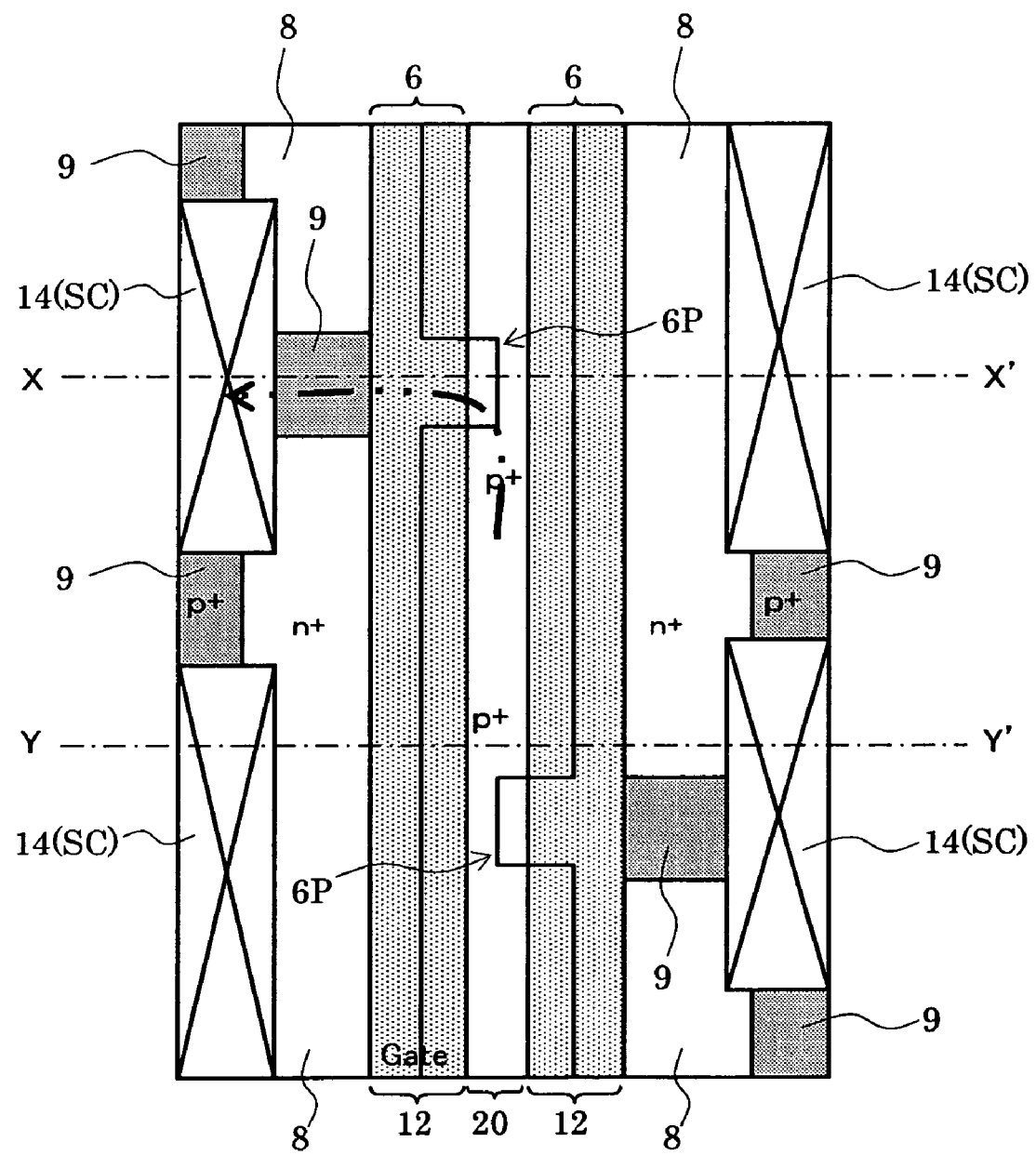
FIG. 14 is a schematic diagram showing the plane structure of the tenth example of the semiconductor device of the invention.

FIG. 14 is a schematic diagram showing the plane structure of the tenth example of the semiconductor device of the invention. That is, this figure expresses the superficial arrangement relation of each element in the surface or the semiconductor layer.

Figure 15:
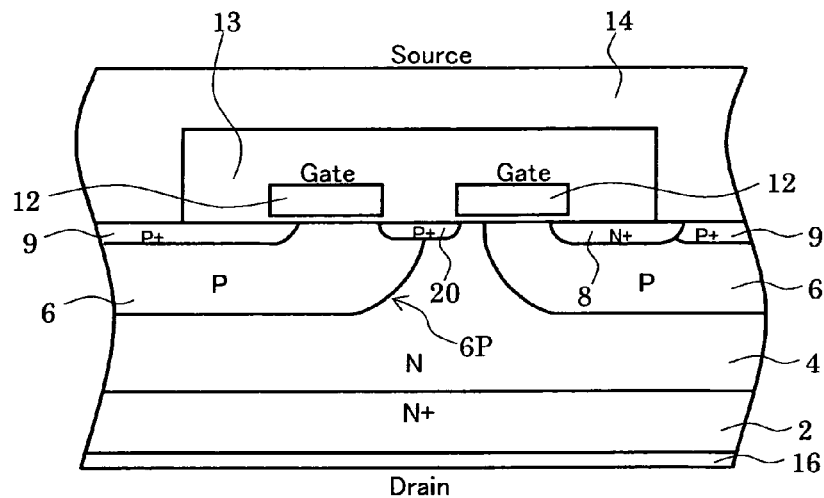
FIG. 15 is the X–X' line sectional view of FIG. 14.

FIG. 15 is its X–X' line sectional view.

Figure 16:
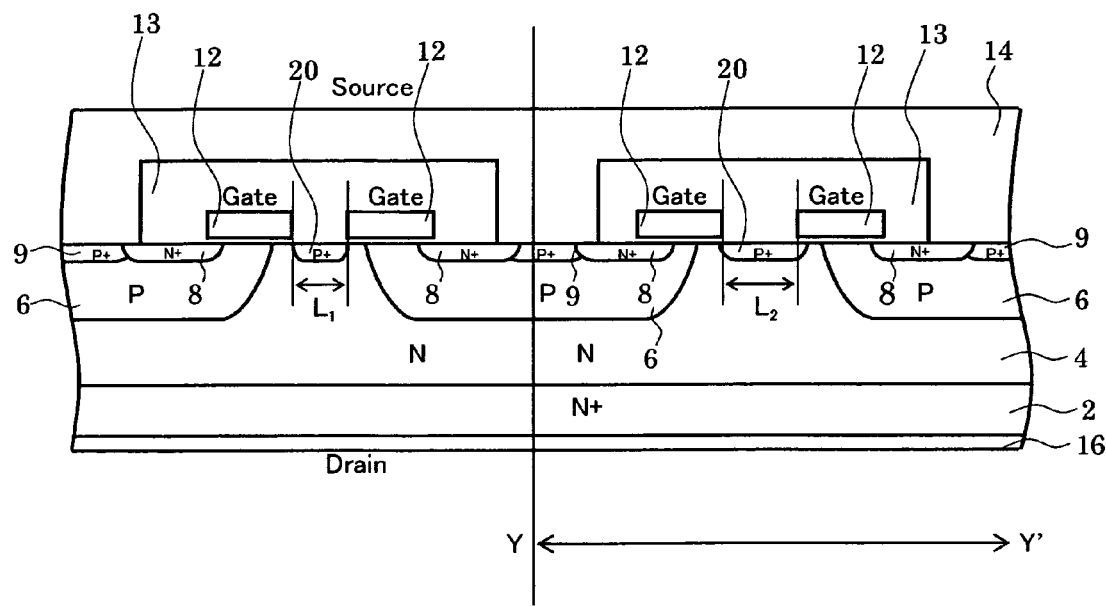
FIG. 16 is the Y–Y' line sectional view of FIG. 14.

Furthermore, FIG. 16 is its Y–Y' line sectional view. FIG. 16 expresses the cross-sectional structure of the region shown in FIG. 14, and the region of the left-hand side which adjoined the region, as will be mentioned later.

According to the example shown in FIG. 14 through FIG. 16, the amount of avalanche breakdown voltage can be improved. Hereafter, this point will be explained, referring to FIGS. 17 and 18.

Figure 17:
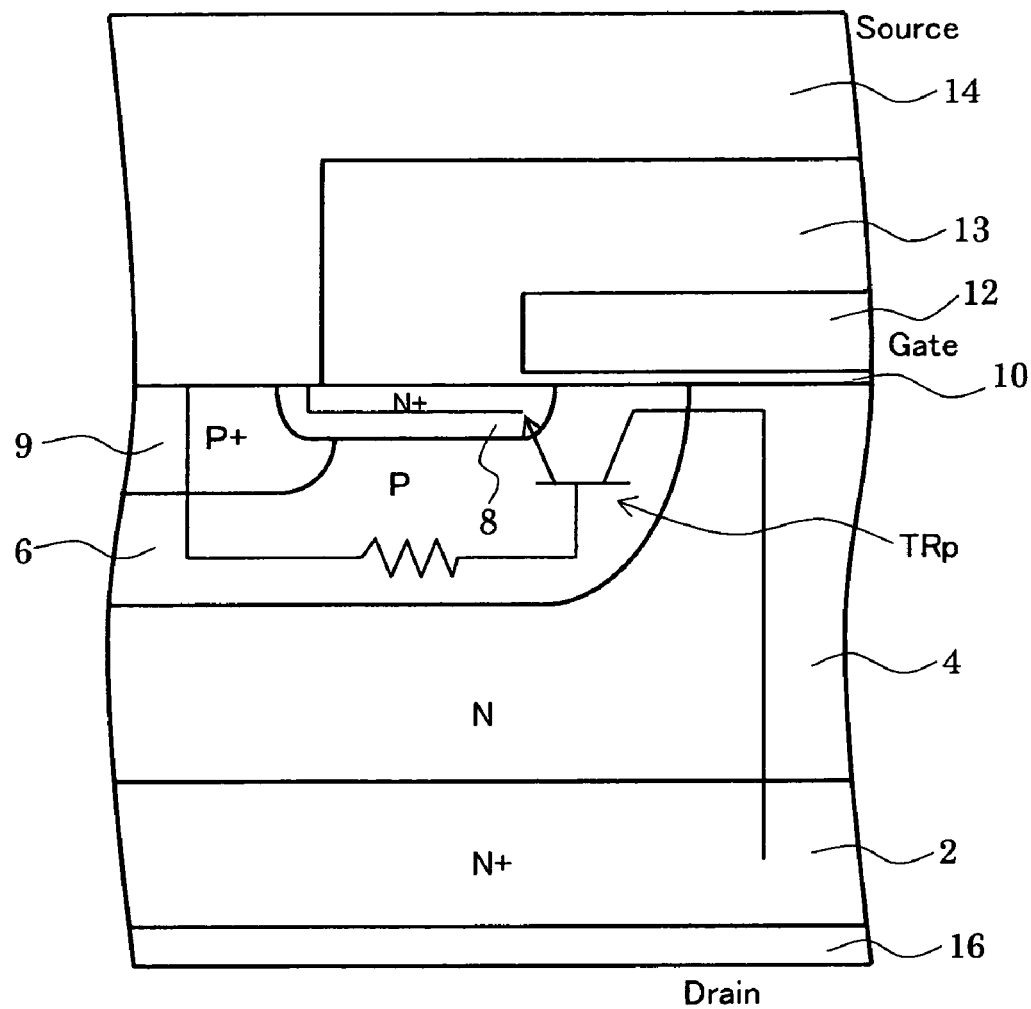
FIG. 17 shows the parasitic NPN transistor TRp which consists of the p type base region 6, the n$^+$ type source region 8, and the n type epitaxial layer 4 exists in the conventional MOSFET.
Figure 18:
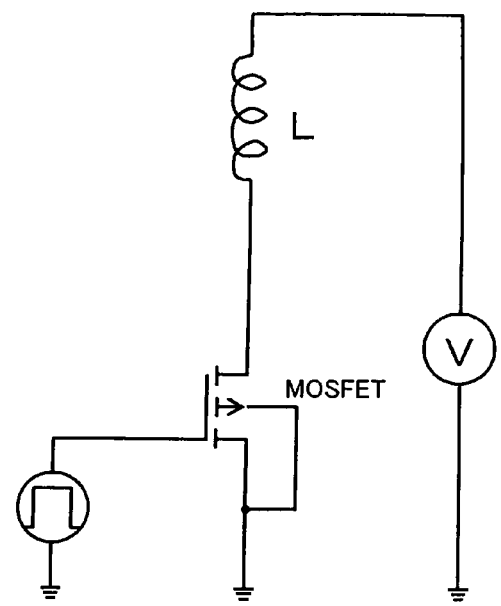
FIG. 18 shows the inductance L made into load.

As expressed in FIG. 17, the parasitic NPN transistor TRp which consists of the p type base region 6, the $n^+$ type source region 8, and the n type epitaxial layer 4 exists in the conventional MOSFET. Here, if MOSFET is changed into an OFF state from an ON state by making the inductance L into load as expressed in FIG. 18, the back electromotive force of the inductance L will be applied between the drain and the source.

Then, depending on the voltage level, an avalanche breakdown of the diode between the drain and the source may occur. Pairs of an electron and a hole is generated by the avalanche breakdown, and the electrons flow to the drain electrode 16 but the holes flow to the source electrode 14 through the p type base region 6.

Then the base and the emitter of the parasitic NPN transistor TRp are biased in a forward direction because current flows to the resistance component R of the p type base region 6, and the parasitic transistor will be in an ON state.

When the parasitic NPN transistor TRp turns on only in a part of the element, current concentrates in that part and finally a physical destruction will occur.

In contrast to this, the avalanche breakdown is made to cause under the $p^+$ type electric field relaxation region 20 in this example.

That is, as expressed in FIGS. 14 and 15, in this example, the $p^+$ type electric field relaxation region 20 is substantially formed in the shape of a stripe, and the p type base region 6 is connected to it in the terminal area 6P. Moreover, in the course from the terminal area 6P to the source electrode contact SC, the $n^+$ type source region 8 is removed.

With such structure, the hole current flows into the source electrode 14 through the p type base region 6 from the $p^+$ type electric field relaxation region 20, as shown with the arrow. If there is provided the $n^+$ source region 8, the parasitic NPN transistor TRp will be formed. However, the $n^+$ type source region 8 is not formed in the region where the electric field relaxation region 20 and the p type base region 6 are connected in this example.

As the result, on the course of the hole current, a simple diode is only formed and the parasitic NPN transistor is not formed. Therefore, the problem that the parasitic NPN turns on and current concentrates can be avoided. That is, the amount of avalanche breakdown of FET is improved.

Here, it is desirable to reduce the resistance of the terminal area 6P which connect the $p^+$ type electric field relaxation region 20 and the p type base region 6 so that the hole current become easy to flow. Moreover, it is desirable to make width of the terminal area 6P wide.

However, if such modifications are employed, the ON resistance of the semiconductor device goes up, since the JFET region will become narrowed.

Therefore, in order to suppress the increase of the ON resistance, as expressed to FIG. 14, only some parts of the device instead of the whole device are made into the structure where the amount of avalanche breakdown becomes high, and other parts of the device are made into the usual structure. Then, it is possible to reconcile the amount avalanche breakdown and ON resistance.

The structure expressed in FIG. 16 is a sectional view showing one of the concrete measures which can lower the breakdown voltages in only a part of the semiconductor device. That is, in this figure, when FETs on both sides are compared, the length L2 of the electric field relaxation region 20 on the right is made longer than the length L1 of the electric field relaxation region 20 on the left.

Thus, if the electric field relaxation region 20 is made longer, the JFET region becomes harder to be depleted and the breakdown voltage between the source and the drain of the FET can be lowered.

Therefore, it becomes possible to lower the breakdown voltage of only a part by providing appropriately a part where the length of the electric field relaxation region is made longer in the semiconductor device.

Heretofore, the embodiments of the present invention have been explained, referring to the examples. However, the present invention is not limited to these specific examples For example, the same effect can be acquired also about the structure where the conduction type of each part of the semiconductor which constitutes FET is reversed.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor device comprising:
   a semiconductor layer of a first conductivity type;
   a pair of base regions of a second conductivity type selectively provided on a surface of the semiconductor layer;
   source regions of a first conductivity type, each of the source regions being selectively provided on a surface of each of the base regions;
   an electrical field reducing region of a second conductivity type selectively provided on the surface of the semiconductor layer between the pair of the base regions;
   a gate insulating film provided on the surface of the base regions;
   a pair of gate electrodes provided on the gate insulating film, each of the gate electrodes being provided on the surface of the base regions between the source region and the electrical field reducing region; and
   a source electrode connected to the source regions,
   the electrical field reducing region being isolated from both of the gate electrode and the source electrode,
   a depth of the electrical field reducing region taken from the surface of the semiconductor layer being smaller than a depth of the base regions taken from the surface of the semiconductor layer.

2. A semiconductor device comprising:
   a semiconductor layer of a first conductivity type;
   a pair of base regions of a second conductivity type selectively provided on a surface of the semiconductor layer;
   source regions of a first conductivity type, each of the source regions being selectively provided on a surface of each of the base regions;
   an electrical field reducing region of a second conductivity type selectively provided on the surface of the semiconductor layer between the pair of the base regions;
   a gate insulating film provided on the surface of the base regions;
   a pair of gate electrodes provided on the gate insulating film, each of the gate electrodes being provided on the surface of the base regions between the source region and the electrical field reducing region; and
   a source electrode connected to the source regions,
   the electrical field reducing region being isolated from both of the gate electrode and the source electrode,
   wherein the base region has a terminal area extending toward the electrical field reducing region, and
   the electrical field reducing region is connected to the base region at the terminal area.

3. The semiconductor device according to claim 2, wherein the source region is selectively removed in a current path from the terminal area to the source electrode.

4. The semiconductor device according to claim 1, wherein the pair of the gate electrodes are formed in a pair of substantially parallel stripes, and
   the gate electrodes of the pair of stripes are connected to each other in a shape of a ladder.

5. The semiconductor device according to claim 1, further comprising a semiconductor region of a first conductivity type between the electrical field reducing region and the base regions, the semiconductor region having an impurity concentration higher than the semiconductor layer.

6. A semiconductor device comprising:
   a semiconductor layer of a first conductivity type;
   a pair of base regions of a second conductivity type selectively provided on a surface of the semiconductor layer;
   source regions of a first conductivity type, each of the source regions being selectively provided on a surface of each of the base regions;
   an electrical field reducing region of a second conductivity type selectively provided on the surface of the semiconductor layer between the pair of the base regions;
   a gate insulating film provided on the surface of the base regions;
   a pair of gate electrodes provided on the gate insulating film, each of the gate electrodes being provided on the surface of the base regions between the source region and the electrical field reducing region;
   a source electrode connected to the source regions.
   the electrical field reducing region being isolated from both of the gate electrode and the source electrode; and
   a polycrystalline silicon layer including impurities of a second conductivity type in contact with a surface of the electrical field reducing region.

7. A semiconductor device comprising:
   a semiconductor layer of a first conductivity type;
   a plurality of base regions of a second conductivity type provided on a surface of the semiconductor layer in a matrix fashion;
   a plurality of source regions of a first conductivity type, each of the source regions being selectively provided on a surface of each of the base regions;
   a plurality of electrical field reducing regions of a second conductivity type, each of the electrical field reducing regions being selectively provided on the surface of the semiconductor layer between the base regions;

a gate insulating film provided on the surface of the base regions;
a gate electrode provided on the gate insulating film, the gate electrode having a lattice pattern in order to selectively cover the surface of the base regions between each of the source regions and each of the electrical field reducing regions; and
a source electrode connected to the source regions,
a depth of the electrical field reducing regions taken from the surface of the semiconductor layer being smaller than a depth of the base regions taken from the surface of the semiconductor layer.

8. A semiconductor device comprising:
a semiconductor layer of a first conductivity type;
a plurality of base regions of a second conductivity type provided on a surface of the semiconductor layer in a matrix fashion;
a plurality of source regions of a first conductivity type, each of the source regions being selectively provided on a surface of each of the base regions;
a plurality of electrical field reducing regions of a second conductivity type, each of the electrical field reducing regions being selectively provided on the surface of the semiconductor layer between the base regions;
a gate insulating film provided on the surface of the base regions;
a gate electrode provided on the gate insulating film, the gate electrode having a lattice pattern in order to selectively cover the surface of the base regions between each of the source regions and each of the electrical field reducing regions; and
a source electrode connected to the source regions,
wherein the electrical field reducing region which is located at a center of four adjoining base regions is surrounded by a semiconductor region of a second conductivity type.

9. The semiconductor device according to claim 7, wherein the electrical field reducing regions are connected to the source electrode.

10. The semiconductor device according to claim 7, further comprising semiconductor regions of a first conductivity type between each of the electrical field reducing regions and each of the base regions, the semiconductor regions having an impurity concentration higher than the semiconductor layer.

11. A semiconductor device comprising:
a semiconductor layer of a first conductivity type;
a plurality of base regions of a second conductivity type provided on a surface of the semiconductor layer in a matrix fashion;
a plurality of source regions of a first conductivity type, each of the source regions being selectively provided on a surface of each of the base regions;
a plurality of electrical field reducing regions of a second conductivity type, each of the electrical field reducing regions being selectively provided on the surface of the semiconductor layer between the base regions;
a gate insulating film provided on the surface of the base regions;
a gate electrode provided on the gate insulating film, the gate electrode having a lattice pattern in order to selectively cover the surface of the base regions between each of the source regions and each of the electrical field reducing regions;
a source electrode connected to the source regions; and
polycrystalline silicon layers including impurities of a second conductivity type, each of the polycrystalline silicon layers being in contact with a surface each of the electrical field reducing regions.

12. A semiconductor device comprising:
a semiconductor layer of a first conductivity type;
a pair of base regions of a second conductivity type provided on a surface of the semiconductor layer;
a pair of source regions of a first conductivity type, each of the source regions being selectively provided on a surface of each of the base regions;
an electrical field reducing region of a second conductivity type selectively provided on the surface of the semiconductor layer between the base regions;
semiconductor regions of a first conductivity type between the electrical field reducing region and each of the base regions, the semiconductor regions having an impurity concentration higher than the semiconductor layer;
a gate insulating film provided on the surface of the base regions;
a pair of gate electrodes provided on the gate insulating film, each of the gate electrodes being provided to selectively cover the surface of each of the base regions between each of the source regions and the electrical field reducing region; and
a source electrode connected to the source regions,
the electrical field reducing region being connected to the source electrode and being isolated from the gate electrode.

13. The semiconductor device according to claim 12, wherein a depth of the electrical field reducing region taken from the surface of the semiconductor layer is smaller than a depth of the base regions taken from the surface of the semiconductor layer.

14. The semiconductor device according to claim 12, further comprising a polycrystalline silicon layer including impurities of a second conductivity type, the polycrystalline silicon layer being in contact with a surface of the electrical field reducing region.

15. The semiconductor device according to claim 14, wherein the electrical field reducing region is made by diffusing the impurities of the second conductivity type from the polycrystalline silicon layer.

16. A semiconductor device comprising:
a semiconductor layer of a first conductivity type;
a pair of base regions of a second conductivity type provided selectively on a surface of the semiconductor layer;
a pair of source regions of a first conductivity type, each of the source regions being provided selectively on a surface of each of the base regions;
a metal layer in contact with the surface of the semiconductor layer between the base regions;
a gate insulating film provided on the surface of the base regions;
a gate electrode provided on the gate insulating film to selectively cover the surface of the base regions between each of the source regions and the metal layer; and
a source electrode connected to the source regions,
the metal layer forming a Schottky junction with the semiconductor layer.

17. The semiconductor device according to claim 16, wherein the metal layer is isolated from the gate electrode and the source electrode.

18. The semiconductor device according to claim 16, wherein the metal layer is connected to the source electrode.

* * * * *